United States Patent
Li

(10) Patent No.: US 8,337,029 B2
(45) Date of Patent: Dec. 25, 2012

(54) LIGHT EMITTING DEVICE WITH PHOSPHOR WAVELENGTH CONVERSION

(75) Inventor: Yi-Qun Li, Danville, CA (US)

(73) Assignee: Intematix Corporation, Fremont, CA (US)

( * ) Notice: Subject to any disclaimer, the term of this patent is extended or adjusted under 35 U.S.C. 154(b) by 116 days.

(21) Appl. No.: 12/355,555

(22) Filed: Jan. 16, 2009

(65) Prior Publication Data

US 2009/0262516 A1  Oct. 22, 2009

Related U.S. Application Data

(60) Provisional application No. 61/021,675, filed on Jan. 17, 2008.

(51) Int. Cl.
*F21V 9/16* (2006.01)

(52) U.S. Cl. .............................. 362/84; 257/98

(58) Field of Classification Search .......... 313/500–512, 313/484–487, 489, 498, 467, 468, 499; 257/98–100, 257/79–81; 362/235, 227, 231, 293, 545, 362/800; 345/44, 46; 438/22, 26, 458

See application file for complete search history.

(56) References Cited

U.S. PATENT DOCUMENTS

| | | | |
|---|---|---|---|
| 5,998,925 A | 12/1999 | Shimizu et al. | |
| 6,350,041 B1 | 2/2002 | Tarsa et al. | |
| 7,311,858 B2 | 12/2007 | Wang et al. | |
| 7,390,437 B2 | 6/2008 | Dong et al. | |
| 2004/0191566 A1* | 9/2004 | Kikuchi et al. | 428/690 |
| 2005/0035365 A1* | 2/2005 | Sato et al. | 257/100 |
| 2006/0145123 A1 | 7/2006 | Li et al. | |
| 2006/0158090 A1 | 7/2006 | Wang et al. | |
| 2006/0243996 A1* | 11/2006 | Ueda et al. | 257/98 |
| 2006/0261309 A1 | 11/2006 | Li et al. | |
| 2007/0029526 A1 | 2/2007 | Cheng et al. | |
| 2007/0090383 A1* | 4/2007 | Ota et al. | 257/98 |
| 2008/0111472 A1 | 5/2008 | Liu et al. | |
| 2008/0218992 A1 | 9/2008 | Li | |

FOREIGN PATENT DOCUMENTS

WO  2004100226 A2  11/2004

* cited by examiner

*Primary Examiner* — Bumsuk Won
*Assistant Examiner* — Elmito Breval
(74) *Attorney, Agent, or Firm* — Fliesler Meyer LLP

(57) ABSTRACT

A light emitting device comprises: an excitation source (LED) operable to generate excitation light of a first wavelength range and a phosphor (photo-luminescent) material configured to absorb at least a part of the excitation radiation and to emit light of a second wavelength range. Light emitted by the device comprises the combined light of the first and second wavelength ranges. The device is characterized by at least the light emitting surface of the excitation source being coated (encapsulated) with an encapsulating material which is transparent to light of the first and second wavelength ranges and which incorporates particles of a thermally conducting material (thermal conductivity $\geq 100$ $Wm^{-1}K^{-1}$, e.g. silver, aluminum or carbon nano-particles) distributed throughout its volume. The phosphor material can be provided on a surface of the encapsulating material, incorporated in the encapsulating material and/or applied to the surface of, or incorporated, in an optical component such as a lens.

19 Claims, 2 Drawing Sheets

LIGHT EMITTING DEVICE WITH PHOSPHOR WAVELENGTH CONVERSION

CLAIM OF PRIORITY

This application claims the benefit of priority to U.S. provisional application No. 61/021,675 filed Jan. 17, 2008, the specification and drawings of which are incorporated herein by reference.

BACKGROUND OF THE INVENTION

1. Field of the Invention

This invention relates to a light emitting device with phosphor wavelength conversion and in particular to a light emitting diode based device with phosphor, photo-luminescent, wavelength conversion to generate a desired color and/or color temperature of light.

2. Description of the Related Art

The development of solid state semiconductor devices, in particular light emitting diodes (LEDs), has opened up the possibility of a new generation of energy efficient lighting solutions. It was not until LEDs emitting in the blue/ultraviolet part of the electromagnetic spectrum were developed that it became practical to develop white light sources based on LEDs ("white LEDs").

It is predicted that white LEDs could potentially replace incandescent, fluorescent and other conventional light sources due to their long operating lifetimes, potentially many hundreds of thousands of hours, and their high efficiency in terms of low power consumption. Recently high brightness white LEDs have been used to replace conventional fluorescent and incandescent light sources.

As taught for example in U.S. Pat. No. 5,998,925, white LEDs include one or more phosphor materials, that is photo-luminescent materials, which absorb a portion of the radiation (light) emitted by the LED chip and re-emit light of a different color (wavelength). Typically, the LED chip or die generates blue light and the phosphor(s) absorb a percentage of the blue light and re-emit yellow light or a combination of green and red light, green and yellow light or yellow and red light. The portion of the blue light generated by the LED that is not absorbed by the phosphor (that is the portion transmitted by the phosphor) is combined with the light emitted by the phosphor and provides light which appears to the human eye as being nearly white in color. Phosphor layers are typically placed, for example, adjacent or in close proximity to a light emitting surface of the LED die/chip from which they derive their excitation energy. Often, the phosphor layer is coated directly onto the LED die to achieve the desired intensity and color of illumination product.

White LEDs are often fabricated by mounting the LED chip in a metallic, high temperature polymer or ceramic cup (package) using an adhesive and then bonding lead wires to the chip. To increase the efficiency of the device, the cup will often have a reflecting inner surface to reflect light out of the device. The phosphor material, which is in powder form, is typically mixed with a light transmissive (transparent) polymer, typically a silicone and the cup filled with the phosphor/polymer mixture such that the light emitting face and edges of the LED chip are covered with a phosphor/polymer encapsulation.

A problem with LEDs, in particular high emission intensity (i.e. ≧50 lumens light intensity) white LEDs as are required in general lighting applications, is thermal management. For example, the intensity of light output of an LED can drop substantially (up to 75%) over an operating temperature range of 20 to 80° C. Furthermore, the elevated operating currents required to achieve a sufficient intensity of emitted light can lead to thermal degradation of the phosphor material. To dissipate heat the packaged LED is typically mounted on a heat sink or other large thermal mass.

The inventor has appreciated that a problem with LEDs with phosphor wavelength conversion is that the phosphor material and/or encapsulating material acts as a thermal insulator, limiting heat escape from the front and/or sides of the device, and this can limit the maximum operating current of the device. As disclosed in U.S. Pat. No. 6,350,041, WO 2004/100226 and our co-pending US patent application publication number US 2008/0218992, the phosphor material can be provided remotely from its associated excitation source to reduce the transfer of heat to the phosphor material.

U.S. Pat. No. 6,350,041 teaches a solid state light source, such as an LED or laser, which transmits light through a separator to a disperser that disperses the light in a desired pattern and/or changes the color of light. The separator spaces the LED a sufficient distance from the disperser such that heat from the LED will not transfer to the disperser when the LED is operated at elevated currents as is necessary for room illumination.

US 2008/0218992 teaches lighting fixtures and systems in which the phosphor is provided on a shade which is located remotely from the excitation source (LED). The shade (optical enclosure) incorporates a phosphor material and is configured to at least in part surround the LED such that excitation radiation propagates in free-space (i.e. it is not guided by an optical medium).

WO 2004/100226 discloses an LED panel lamp comprising an enclosure housing a plurality of UV emitting LEDs and a removable front light emitting panel containing a UV excitable phosphor material. The phosphor material is spaced from the LEDs by the height of the enclosure.

Although providing the phosphor material remotely to its associated excitation source reduces the transfer of heat to the phosphor material, such devices can be too bulky for many applications. A need exists therefore for compact light emitting devices with improved thermal characteristics.

SUMMARY OF THE INVENTION

The present invention arose in an endeavor to provide a light emitting device with phosphor wavelength conversion which at least in part has an improved thermal stability compared with the known devices.

According to the invention there is provided a light emitting device comprising: an excitation source (preferably a blue light emitting diode) operable to generate excitation light of a first wavelength range and at least one phosphor material configured to absorb at least a part of the excitation light and to emit light of a second wavelength range; the device being characterized in that at least the light emitting surface of the excitation source is coated with an encapsulating material which is substantially transmissive to light of the first and second wavelength ranges and which incorporates a thermally conducting material. The thermally conducting material is preferably in the form of particles which are distributed throughout the volume of the encapsulating material and assists in the conduction of heat away from the light emitting surface(s) of the excitation source.

To ensure heat is uniformly distributed, the particles of the thermally conducting material are substantially evenly distributed throughout the volume of the encapsulating material.

The thermally conducting material comprises a material that is a good thermal conductor and has a thermal conductivity of the order of at least 100 $Wm^{-1}K^{-1}$. Preferably, the thermal conductivity of the thermally conducting material is of the order of at least 150 $Wm^{-1}K^{-1}$ and advantageously of the order of at least 200 $Wm^{-1}K^{-1}$. The thermally conducting material can comprise a metal such as silver, aluminum, copper, chromium, steel, nickel or gold. Alternatively, the thermally conducting material can comprise a thermally conducting ceramic material such as aluminum silicon carbide.

To reduce the absorption of light by the thermally conducting particles, the particles of the thermally conducting material are preferably reflective to light of the first and second wavelength ranges. Alternatively and/or in addition, the particles of thermally conducting material can have a principal dimension which is of the order of, or less than, the shortest wavelength of light emitted by the device. Generally, the shortest wavelength of light generated by the device will be light generated by the excitation source, such as blue light of wavelength 400 to 480 nm, since many phosphor materials emit light of a longer wavelength (so called wavelength down-converting phosphors). Accordingly, the thermally conducting particles preferably have a principal dimension in a range 100 to 700 nm. Typically such thermally conducting particles can comprise nano-particles of carbon or graphite which can be in the form of nano-tubes, nano-rods, nano-spheres etc.

The relative proportion of thermally conducting material to encapsulating material is selected to strike a balance between increasing the thermal conductivity of the encapsulating material and not appreciably decreasing light transmission through the encapsulating material. In a typical arrangement, the ratio of the thermally conducting material to encapsulating material is in a range 1 to 25% by volume.

The encapsulating material can comprise a silicone or an epoxy material.

In one arrangement the phosphor material is provided on a surface of the encapsulating material, preferably the surface of the encapsulating material that is distal to the excitation source. Alternatively, the phosphor material can be incorporated in the encapsulating material and is distributed throughout its volume. To ensure a uniform color of generated light across the surface of the device, the phosphor material is preferably substantially evenly distributed throughout the volume of the encapsulating material. Typically, the ratio of phosphor material to encapsulating material is in a range 10 to 25% by volume. Where the device includes additional optical components, such as for example a lens, for focusing or otherwise directing the light emission of the device the phosphor material can be provided on a surface of the optical component or incorporated within the optical component.

The phosphor material can comprise: a silicate-based phosphor; an aluminate-based phosphor; a nitride-based phosphor material; a sulfate-based phosphor material; an oxy-nitride-based phosphor; an oxy-sulfate-based phosphor or a garnet material (YAG).

BRIEF DESCRIPTION OF THE DRAWINGS

In order that the present invention is better understood embodiments of the invention will now be described, by way of example only, with reference to the accompanying drawings in which.

DETAILED DESCRIPTION OF THE INVENTION

Embodiments of the invention are directed to light emitting devices, in particular those based on light emitting diodes (LEDs), in which at least the light emitting surface of the LED is coated (covered) with a light transmissive (transparent) medium containing particles of a thermally conducting material distributed throughout its volume. The phosphor (photoluminescent) material used to achieve a selected color of emitted light can be provided on a surface of the transparent encapsulation, dispersed together with the thermally conducting material within the transparent encapsulation material or provided on the surface of, or incorporated within, an optical component such as a lens that is used to focus or otherwise direct light emitted by the device. The transparent, thermally conducting, encapsulation provides a conduction path for the flow of heat away from the light emitting surface of the LED. In contrast to known LEDs that incorporate a small surface area of phosphor, typically a fraction to a millimeter squared ($mm^2$) or so, in contact with the LED die/chip, the phosphor material of the device of the invention is provided over a relatively larger surface area (or distributed throughout a volume). Although heat may still be absorbed by the phosphor material since it is distributed over a larger surface area (volume) this reduces the likelihood of thermal degradation.

Figure 1:
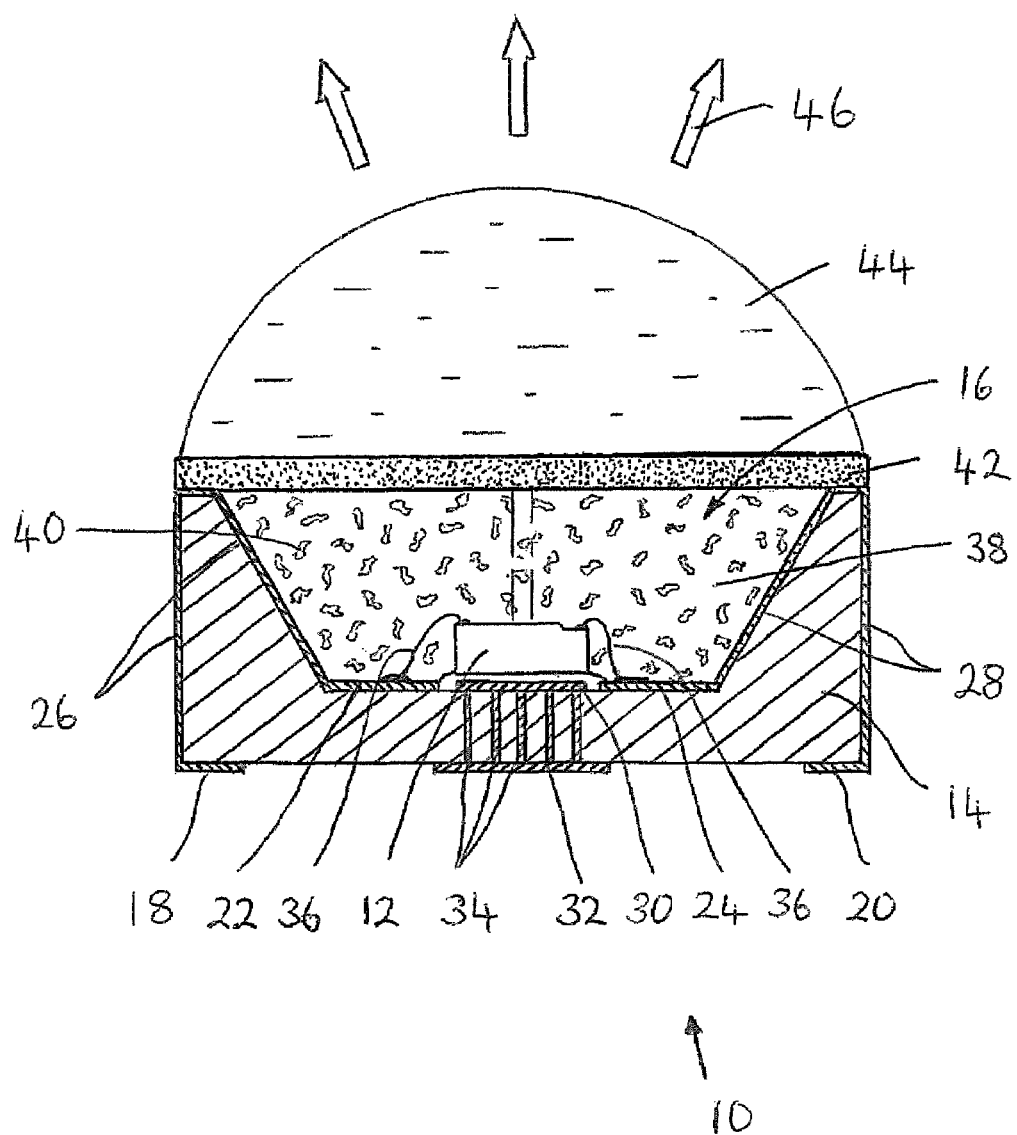
FIG. 1 is a schematic cross-sectional representation of a light emitting device in accordance with the invention.

Referring to FIG. 1 there is shown a light emitting device 10 in accordance with the invention which is intended to generate white light of a specific correlated color temperature (CCT) though it will be appreciated that the device of the invention can be configured to generate any other color and/or CCT of light. The device 10 comprises an LED chip 12 mounted within a dish-shaped package (housing) 14. The package 14 preferably comprises a high temperature package such as for example a low temperature co-fired ceramic (LTCC) package of a type as described in co-pending patent application Ser. No. 12/127,749 filed May 27, 2008, the specification and drawings of which are incorporated herein by reference. The package 14 has in an upper surface a circular reflective recesses (cup) 16 which is configured to receive the LED chip 12. The package 14 further comprises electrical contact pads 18, 20 on the base of the package for connecting the device to an electrical power source. Each of the contact pads 18, 20 is electrically connected to a corresponding electrode contact pad 22, 24 on the floor of the recess 16 by a respective metallization layer 26, 28 on the exterior surface of the package. The walls of the recess 16 are inclined and the metallization layers 26, 28 are additionally configured to cover the majority of the walls and floor of the recess such as to reflect light out of the device. The LED chip 12 is mounted to a thermally conducting mounting pad 30 on the floor of the recess 16 using for example a thermally conductive adhesive or eutectic soldering. The thermally conducting mounting pad 30 is thermally connected with a corresponding mounting pad 32 on the base of the package by an array of thermally conducting vias 34. Electrode pads on the upper surface of the LED chip 12 are electrically connected to a corresponding electrode contact pad 22, 24 by one or more bond wires 36. The LED chip 12 is operable to generate light of wavelength $\lambda_1$ and preferably comprises an InGaN/GaN (indium gallium nitride/gallium nitride) based surface emitting LED chip which generates blue light of wavelength range 400 to 480 nm.

The light emitting surface of the LED chip 12 is covered (encapsulated or potted) with a transparent encapsulating material 38, for example a silicone material such as GE's RTV615 or a thermal or UV cured epoxy material. The transparent encapsulating material 38, which will hereinafter be referred to as an encapsulating material, incorporates a thermally conducting material 40, such as particles of silver, which are distributed uniformly throughout the volume of the encapsulating material. Typically, the silver particles 40 have an average size of ≈0.1 to 0.5 mm and the ratio of thermally conducting material 40 to transparent encapsulating material 38 is typically in a range 1 to 25% by volume. The device 10 can be fabricated by mixing the silver particles 40 with the encapsulating material and then dispensing a pre-selected quantity of the encapsulating mixture to cover and pot the LED chip 12. The encapsulating material is conveniently dispensed using for example a nano liter size plunger type dispenser head as made by Asymtek. As shown in FIG. 1, the recess 16 is preferably filled with the encapsulating material 38 to optimize thermal communication between the encapsulating material and the package.

A phosphor, photo-luminescent, material 42 is provided as a substantially uniform thickness layer over the majority of the exposed surface of the transparent encapsulation 38. The phosphor material can be deposited by for example dispensing a mixture of the phosphor material and a binder onto the surface of the encapsulation layer using for example a nano liter size plunger type dispenser head as made by Asymtek. It will be appreciated that the phosphor material can be deposited by other deposition methods such as spraying, screen printing, ink jet printing and so forth. Optionally, a lens 44 can be provided over the front opening of the package to focus or otherwise direct light 46 emitted by the device 10.

As will be described light generated by the LED chip 12 can provide two functions; firstly it provides excitation radiation for exciting the phosphor material 42 and secondly it can comprise a part of the final emission product 46. In view of the former function the light generated by the LED chip will hereinafter be referred to as excitation light.

The phosphor material 42 can comprise any photo-luminescent material which is capable of being excited by the excitation light such as for example, can comprise an inorganic or organic phosphor such as for example silicate-based phosphor of a general composition $A_3Si(O,D)_5$ or $A_2Si(O,D)_4$ in which Si is silicon, O is oxygen, A comprises strontium (Sr), barium (Ba), magnesium (Mg) or calcium (Ca) and D comprises chlorine (Cl), fluorine (F), nitrogen (N) or sulfur (S). Examples of silicate-based phosphors are disclosed in our co-pending patent applications US2006/0145123, US2006/0261309, US2007/0029526 and patent U.S. Pat. No. 7,311,858 (also assigned to Intematix Corporation) the content of each of which is hereby incorporated by way of reference thereto.

As taught in US2006/0145123, a europium ($Eu^{2+}$) activated silicate-based green phosphor has the general formula $(Sr,A_1)_x(Si,A_2)(O,A_3)_{2+x}:Eu^{2+}$ in which: $A_1$ is at least one of a $2^+$ cation, a combination of $1^+$ and $3^+$ cations such as for example Mg, Ca, Ba, zinc (Zn), sodium (Na), lithium (Li), bismuth (Bi), yttrium (Y) or cerium (Ce); $A_2$ is a $3^+$, $4^+$ or $5^+$ cation such as for example boron (B), aluminum (Al), gallium (Ga), carbon (C), germanium (Ge), N or phosphorus (P); and $A_3$ is a $1^-$, $2^-$ or $3^-$ anion such as for example F, Cl, bromine (Br), N or S. The formula is written to indicate that the $A_1$ cation replaces Sr; the $A_2$ cation replaces Si and the $A_3$ anion replaces oxygen. The value of x is an integer or non-integer between 1.5 and 2.5.

U.S. Pat. No. 7,311,858 discloses a silicate-based yellow-green phosphor having a formula $A_2SiO_4:Eu^{2+}$ D, where A is at least one of a divalent metal comprising Sr, Ca, Ba, Mg, Zn or cadmium (Cd); and D is a dopant comprising F, Cl, Br, iodine (I), P, S and N. The dopant D can be present in the phosphor in an amount ranging from about 0.01 to 20 mole percent and at least some of the dopant substitutes for oxygen anions to become incorporated into the crystal lattice of the phosphor. The phosphor can comprise $(Sr_{1-x-y}Ba_xM_y)SiO_4:Eu^{2+}D$ in which M comprises Ca, Mg, Zn or Cd and where $0 \leq x \leq 1$ and $0 \leq y \leq 1$.

US2006/0261309 teaches a two phase silicate-based phosphor having a first phase with a crystal structure substantially the same as that of $(M1)_2SiO_4$; and a second phase with a crystal structure substantially the same as that of $(M2)_3SiO_5$ in which M1 and M2 each comprise Sr, Ba, Mg, Ca or Zn. At least one phase is activated with divalent europium ($Eu^{2+}$) and at least one of the phases contains a dopant D comprising F, Cl, Br, S or N. It is believed that at least some of the dopant atoms are located on oxygen atom lattice sites of the host silicate crystal.

US2007/0029526 discloses a silicate-based orange phosphor having the formula $(Sr_{1-x}M_x)_yEu_zSiO_5$ in which M is at least one of a divalent metal comprising Ba, Mg, Ca or Zn; $0<x<0.5$; $2.6<y<3.3$; and $0.001<z<0.5$. The phosphor is configured to emit visible light having a peak emission wavelength greater than about 565 nm.

The phosphor can also comprise an aluminate-based material such as is taught in our co-pending patent application US2006/0158090 and U.S. Pat. No. 7,390,437 (also assigned to Intematix Corporation) or an aluminum-silicate phosphor as taught in co-pending application US2008/0111472 the content of each of which is hereby incorporated by way of reference thereto.

US2006/0158090 teaches an aluminate-based green phosphor of formula $M_{1-x}Eu_xAl_yO_{[1+3y/2]}$ in which M is at least one of a divalent metal comprising Ba, Sr, Ca, Mg, Mn, Zn, Cu, Cd, Sm or thulium (Tm) and in which $0.1<x<0.9$ and $0.5 \leq y \leq 12$.

U.S. Pat. No. 7,390,437 discloses an aluminate-based blue phosphor having the formula $(M_{1-x}Eu_x)_{2-z}Mg_zAl_yO_{[2+3y/2]}$ in which M is at least one of a divalent metal of Ba or Sr. In one composition the phosphor is configured to absorb radiation in a wavelength ranging from about 280 nm to 420 nm, and to emit visible light having a wavelength ranging from about 420 nm to 560 nm and $0.05<x<0.5$ or $0.2<x<0.5$; $3 \leq y \leq 12$ and $0.8 \leq z \leq 1.2$. The phosphor can be further doped with a halogen dopant H such as Cl, Br or I and be of general composition $(M_{1-x}Eu_x)_{2-z}Mg_zAl_yO_{[2+3y/2]}:H$.

US2008/0111472 teaches an aluminum-silicate orange-red phosphor with mixed divalent and trivalent cations of general formula $(Sr_{1-x-y}M_xT_y)_{3-m}Eu_m(Si_{1-z}Al_z)O_5$ in which M is at least one divalent metal selected from Ba, Mg or Ca in an amount ranging from $0 \leq x \leq 0.4$; T is a trivalent metal selected from Y, lanthanum (La), Ce, praseodymium (Pr), neodymium (Nd), promethium (Pm), samarium (Sm), gadolinium (Gd), terbium (Tb), dysprosium (Dy), holmium (Ho), Erbium (Er), Tm, ytterbium (Yt), lutetium (Lu), thorium (Th), protactinium (Pa) or uranium (U) in an amount ranging from $0 \leq y \leq 0.4$ and z and m are in a range $0 \leq z \leq 0.2$ and $0.001 \leq m \leq 0.5$. The phosphor is configured such that the halogen resides on oxygen lattice sites within the silicate crystal.

The phosphor can also comprise a nitride-based red phosphor material such as is taught in our co-pending provisional patent application 61/054,399 the content of which is hereby incorporated by way of reference thereto. 61/054,399 teaches a nitride-based red phosphor having the formula $M_mM_aM_bD_{3w}N_{[(2/3)m+z+a+(4/3)b-w]}Z_x$ where $M_m$ is a divalent element selected from beryllium (Be), Mg, Ca, Sr, Ba, Zn, Cd or mercury (Hg); $M_a$ is a trivalent element selected from B, Al, Ga, In, Y, Se, P, As, La, Sm, antimony (Sb) or Bi; $M_b$ is a tetravalent element selected from C, Si, Ge, tin (Sn), Ni, hafnium (Hf), molybdenum (Mo), tungsten (W), Cr, Pb, Ti or zirconium (Zr); D is a halogen selected from F, Cl, Br or I; Z is an activator selected from Eu, Ce, Mn, Tb or Sm, and N is nitrogen in amounts $0.01 \leq m \leq 1.5$, $0.01 \leq a \leq 1.5$, $0.01 \leq b \leq 1.5$, $0.0001 \leq w \leq 0.6$ and $0.0001 \leq z \leq 0.5$. The phosphor is configured to emit visible light with an emission peak wavelength greater than 640 nm.

It will be appreciated that the phosphor material is not limited to the examples described and can comprise any phosphor material including both organic or inorganic phosphor materials such as for example nitride and/or sulfate phosphor materials, oxy-nitrides and oxy-sulfate phosphors or garnet materials (YAG).

The light emitting device 10 of FIG. 1 is configured to generate cool white (CW) light having a correlated color temperature (CCT) of ≈7000K and the phosphor material 42 can comprise, for example, a silicate-based green light emitting phosphor material which generates light of wavelength $\lambda_2 \approx 500$ to 540 nm, a garnet or silicate-based yellow light emitting phosphor which generates light of wavelength $\lambda_2 \approx 540$ to 580 nm, a mixture of silicate-based green and orange light emitting phosphors or a mixture of a silicate-based green and nitride-based red light emitting phosphors.

In operation, excitation light emitted by the LED chip 12 is transmitted through the encapsulation material 38 to the layer of phosphor material 42. The phosphor material 42 absorbs a proportion of the excitation light causing excitation of the phosphor which re-emits green light of wavelength $\lambda_2$. Light 46 emitted from the lens 44, which comprises the final emission product, is a combination of green light ($\lambda_2$) generated by the phosphor and blue excitation light ($\lambda_1$) not absorbed by the phosphor and this will appear to the human eye as being white in color. The proportion of blue excitation light absorbed by the phosphor will depend on the density of phosphor material per unit area and the thickness of the phosphor layer 42. Due to the isotropic nature of phosphor luminescence this implies that the phosphor will emit about 50% of its radiation in a direction back into the device. Such light will be reflected by the reflecting inner surfaces 26, 28 of the package 14 and to an extent by the thermally conducting silver particles 40 back towards the light emitting opening of the package.

The thermally conducting silver particles 40 further assist in the conduction of heat away from the light emitting surface of the LED chip 12 to the package and to the front of the encapsulation layer. Heat which is conducted to the package can be readily dissipated by the metallization layers 26, 28 on the recess wall. Alternatively, the package 14 can be fabricated from a thermally conducting material such as a thermally conducting ceramic. Typically in operation the package mounting pad 32 will be mounted in thermal communication with a heat sink or other large thermal mass using a heat sink compound. Although heat which is conducted to the front of the encapsulation layer may be absorbed by the phosphor layer 42 this is less likely to result in a degradation of the phosphor compared to the known devices in which the phosphor is applied directly to the LED chip since the phosphor material is distributed over a larger surface area.

It will be appreciated that the thermally conducting material can comprise particles of any material that is a good thermal conductor and has a thermal conductivity that is typically of the order of 100 $Wm^{-1}K^{-1}$ or greater. Preferably, the thermal conductivity of the thermally conducting material is of the order of at least 150 $Wm^{-1}K^{-1}$ and advantageously of the order of at least 200 $Wm^{-1}K^{-1}$. Accordingly it is envisaged that the thermally conducting material comprise silver (≈429 $Wm^{-1}K^{-1}$), copper (≈400 $Wm^{-1}K^{-1}$), gold (≈318 $Wm^{-1}K^{-1}$), aluminum (≈250 $Wm^{-1}K^{-1}$), an alloy of aluminum, a magnesium alloy, nickel (≈100 $Wm^{-1}K^{-1}$), a nickel alloy, chromium (≈95 $Wm^{-1}K^{-1}$), a chromium alloy or a thermally conducting ceramic material such as for example aluminum silicon carbide (AlSiC) (≈170 to 200 $Wm^{-1}K^{-1}$). To reduce absorption by the thermally conducting particles of excitation and phosphor generated light, the particles of the thermally conducting material are preferably reflective to both the excitation and phosphor generated light and can comprise for example aluminum, chromium, steel, nickel or gold. Alternatively and/or in addition, the particles of thermally conducting material can have a principal dimension which is of the order of, or less than, the shortest wavelength of light emitted by the device. Typically, the shortest wavelength of light generated by the device will be light generated by the excitation source, such as blue light of wavelength 400 to 480 nm, as many phosphor materials emit light of a longer wavelength (so called wavelength down-converting phosphors). In one such embodiment, the thermally conducting particles can be of dimensions that are in a range 100 to 700 nm and comprise carbon or graphite nano-particles which can be in the form of nano-tubes, nano-rods, nano-spheres etc.

It will be appreciated that in either case the relative proportion of thermally conducting material to encapsulating material needs to be selected to strike a balance between increasing the thermal conductivity of the encapsulating material whilst not appreciably decreasing light transmission through the encapsulating material. In a typical arrangement, the ratio of the thermally conducting material to encapsulating material is in a range 1 to 25% by volume.

Figure 2:
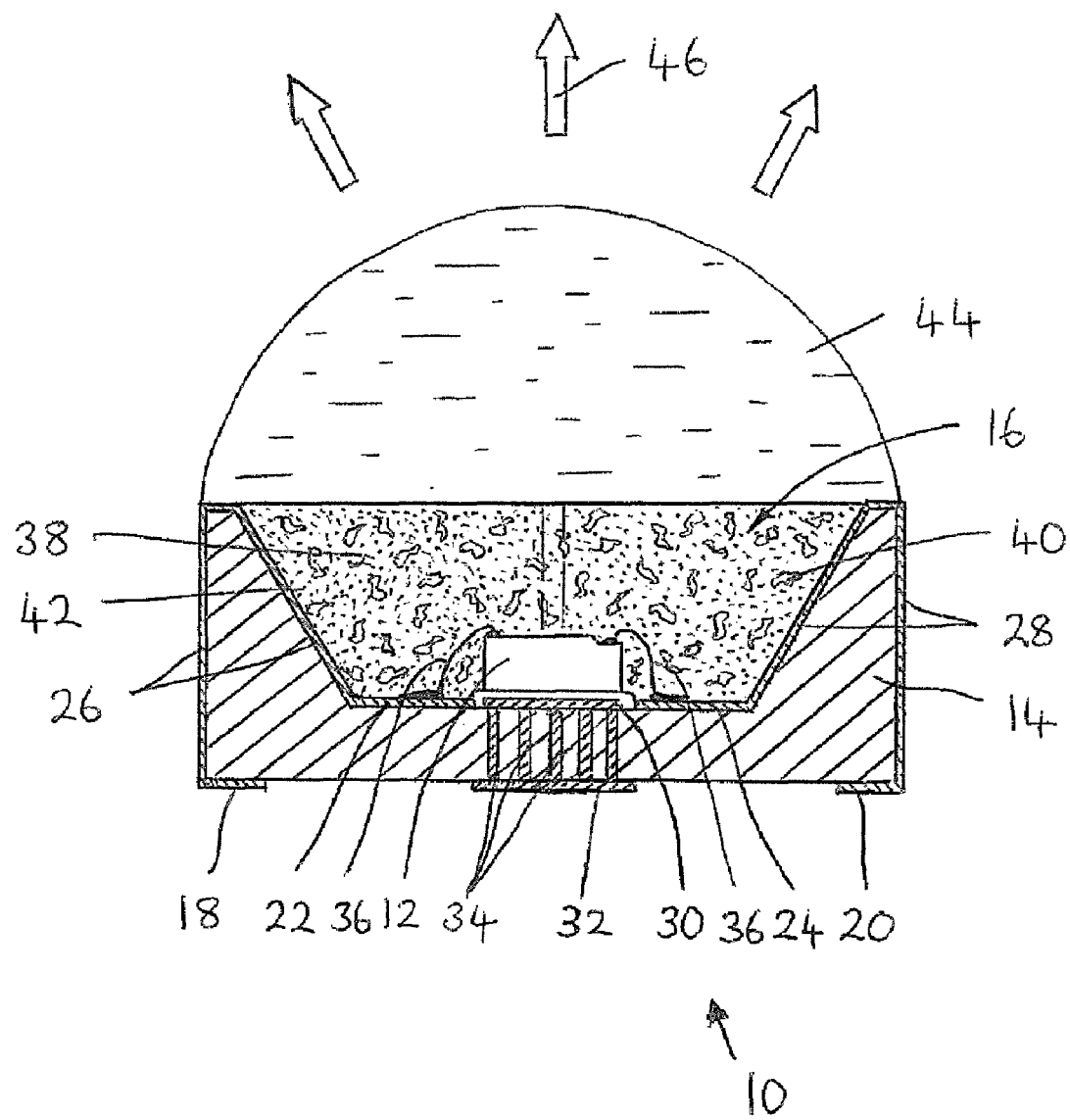
FIG. 2 is a schematic cross-sectional representation of a light emitting device in accordance with a further embodiment of the invention.

In other embodiments, as for example illustrated in FIG. 2, the phosphor material can be incorporated in the transparent encapsulating material 38. In FIG. 2 particles of the phosphor material 42 are indicated by dots. Although the thermally conducting particles 40 are depicted as being larger than particles of the phosphor material, in practice they can be of similar size or smaller than the phosphor particles. To fabricate such a device the phosphor material, thermally conducting material and encapsulating material are mixed in known proportions and a pre-selected quantity (volume) of the encapsulating mixture dispensed on the LED chip 12. Since the total quantity of phosphor material in the encapsulating layer 38 will affect the color of the light 46 emitted by the device and to ensure a consistent color of emitted light, the encapsulating material mixture is preferably dispensed using a nano liter size plunger type dispenser head such as those made by Asymtek. Moreover, to ensure a uniform generation of light color, the phosphor material is evenly distributed throughout the volume of the encapsulating material.

It will be appreciated that the present invention is not restricted to the specific embodiments described and that variations can be made that are within the scope of the invention. For example, the phosphor material can be incorporated or provided on the surface of the lens 44 or other optical component. In the exemplary embodiments described, which relate to light emitting devices for generating white light, a proportion of the excitation light contributes to the final emitted light. Where it is required to generate a single color light, sufficient phosphor material can be provided such that all of the excitation light is absorbed by the phosphor material and light emitted by the device comprises only phosphor generated light. In other arrangements a mixture of different phosphor material can be used to generate a selected color and/or color temperature of emitted light.

Moreover, whilst in the examples described a single LED chip is packaged in a respective package, in other embodiments it is envisaged to co-package a number of LED chips in a single package.

What is claimed is:

1. A light emitting device comprising:
    an excitation source operable to generate excitation light of a first wavelength range; and
    at least one phosphor material configured to absorb at least a part of the excitation light and to emit light of a second wavelength range,
    wherein at least the light emitting surface of the excitation source is coated with an encapsulating material which is substantially transmissive to light of the first and second wavelength ranges, and
    wherein the encapsulating material incorporates a thermally conducting material distributed throughout its volume, and wherein the thermally conducting material is selected from the group consisting of a carbon, and graphite.

2. The device according to claim 1, wherein the thermally conducting material is in particulate form, and wherein particles of the thermally conducting material are substantially evenly distributed throughout the volume of the encapsulating material.

3. The device according to claim 1, wherein the thermally conducting material has a thermal conductivity of the order of at least 100 $Wm^{-1}K^{-1}$, at least 150 $Wm^{-1}K^{-1}$, or at least 200 $Wm^{-1}K^{-1}$.

4. The device according to claim 1, wherein the particles of the thermally conducting material are reflective to light of the first and second wavelength ranges.

5. The device according to claim 1, wherein the particles of the thermally conducting material have a principal dimension which is substantially of the order of, or less than the shortest wavelength of light emitted by the device.

6. The device according to claim 5, wherein the principal dimension is in a range 150 to 700 nm.

7. The device according to claim 1, wherein the ratio of the thermally conducting material to encapsulating material is in a range 1 to 25% by volume.

8. The device according to claim 1, wherein the encapsulating material is selected from the group consisting of a silicone and an epoxy material.

9. The device according to claim 1, wherein the phosphor material is provided on at least a part of the surface of the encapsulating material.

10. The device according to claim 1, wherein the phosphor material is incorporated in the encapsulating material and is distributed throughout its volume.

11. The device according to claim 10, wherein the phosphor material is substantially evenly distributed throughout the volume of the encapsulating material.

12. The device according to claim 10, wherein the ratio of the phosphor material to encapsulating material is in a range 10 to 25% by volume.

13. The device according to claim 1, and further comprising an optical component and wherein the phosphor material is provided on at least a part of the surface of the optical component or incorporated within the component.

14. The device according to claim 1, wherein the phosphor material is selected from the group consisting of: a silicate-based phosphor; an aluminate-based phosphor; a nitride-based phosphor material; a sulfate-based phosphor material; an oxy-nitride-based phosphor; an oxy-sulfate-based phosphor; and a garnet material.

15. The light emitting device according to claim 1, wherein the excitation source comprises a light emitting diode.

16. A light emitting device comprising:
    a light emitting diode operable to generate excitation light of a first wavelength range; and
    at least one phosphor material configured to absorb at least a part of the excitation light and to emit light of a second wavelength range,
    wherein at least the light emitting surface of the light emitting diode is coated with an encapsulating material which is substantially transmissive to light of the first and second wavelength ranges, and
    wherein the encapsulating material incorporates a thermally conducting material distributed throughout its volume, and wherein the thermally conducting material is selected from the group consisting of a carbon, and graphite.

17. The light emitting device according to claim 1, wherein the excitation source is mounted to a thermal conducting mounting pad, which is mounted in thermal communication with a heat sink or a large thermal mass using a heat sink compound.

18. The light emitting device according to claim 1, wherein the flow of heat is conducted to a package of the light emitting device that uses one or more metallization layers to dissipate the heat, and the package is fabricated from a thermally conducting ceramic.

19. The light emitting device according to claim 1, wherein the flow of heat is conducted to a phosphor layer that has a larger surface than the light emitting surface of the excitation source.

* * * * *